United States Patent
Kizaki

(10) Patent No.: US 12,379,272 B2
(45) Date of Patent: Aug. 5, 2025

(54) APPARATUS AND METHOD FOR DETECTING TENSION ABNORMALITY IN DICING TAPE

(71) Applicant: TOKYO SEIMITSU CO., LTD., Hachioji (JP)

(72) Inventor: Kiyotaka Kizaki, Tokyo (JP)

(73) Assignee: TOKYO SEIMITSU CO., LTD., Tokyo (JP)

(*) Notice: Subject to any disclaimer, the term of this patent is extended or adjusted under 35 U.S.C. 154(b) by 0 days.

(21) Appl. No.: 18/272,064

(22) PCT Filed: Nov. 12, 2021

(86) PCT No.: PCT/JP2021/041646
§ 371 (c)(1),
(2) Date: Jul. 12, 2023

(87) PCT Pub. No.: WO2022/168391
PCT Pub. Date: Aug. 11, 2022

(65) Prior Publication Data
US 2024/0302232 A1    Sep. 12, 2024

(30) Foreign Application Priority Data
Feb. 5, 2021 (JP) ................. 2021-017859

(51) Int. Cl.
*G01L 5/04* (2006.01)
*H01L 21/20* (2006.01)
(Continued)

(52) U.S. Cl.
CPC ............ *G01L 5/04* (2013.01); *H01L 21/6836* (2013.01); *H01L 21/20* (2013.01); *H01L 21/26* (2013.01);
(Continued)

(58) Field of Classification Search
CPC ....... G01L 5/04; H01L 21/6836; H01L 21/30; H01L 21/20; H01L 21/26; H01L 21/67242; H01L 21/683
(Continued)

(56) References Cited

U.S. PATENT DOCUMENTS 9,685,355 B2 * 6/2017 Hyakumura ....... B23K 26/0622
2009/0065126 A1 * 3/2009 Nonaka ............. H01L 21/67132
156/60
(Continued)

FOREIGN PATENT DOCUMENTS

DE    3920310 A * 12/1989 ........... B65H 23/044
JP    H0415031 U * 2/1992
(Continued)

OTHER PUBLICATIONS

Translation JP2019175927 (Year: 2019).*
(Continued)

*Primary Examiner* — Peter J Macchiarolo
*Assistant Examiner* — Monica S Young
(74) *Attorney, Agent, or Firm* — Fattibene and Fattibene, LLC; Paul A. Fattibene

(57) ABSTRACT

An apparatus and a method for detecting a tension abnormality in a dicing tape, to quantitively determine whether or not tension of the dicing tape is appropriate and accurately detected. A tension abnormality detecting apparatus 4 includes an air micrometer 41 that measures, displacement of a dicing tape DT occurring when air is blown to a measurement point P to which a workpiece W is not affixed. A determination unit 42 determines the tension of the dicing tape DT is appropriate when the tension of the dicing tape DT at the measurement point P belongs in a previously set proper range and determines that the tension of the dicing tape DT is abnormal when the tension of the dicing tape DT
(Continued)

at the measurement point P does not belong in the proper range.

8 Claims, 8 Drawing Sheets

(51) Int. Cl.
   *H01L 21/26* (2006.01)
   *H01L 21/30* (2006.01)
   *H01L 21/67* (2006.01)
   *H01L 21/683* (2006.01)

(52) U.S. Cl.
   CPC ........ *H01L 21/30* (2013.01); *H01L 21/67242* (2013.01)

(58) Field of Classification Search
   USPC .................................................... 73/862.391
   See application file for complete search history.

(56) References Cited

U.S. PATENT DOCUMENTS

| | | | |
|---|---|---|---|
| 2020/0075387 A1* | 3/2020 | Saito | ........................ C09J 7/00 |
| 2020/0286795 A1 | 9/2020 | Leitgeb et al. | ......... H01L 22/12 |

FOREIGN PATENT DOCUMENTS

| | | | | |
|---|---|---|---|---|
| JP | H05126652 | | 5/1993 | |
| JP | H05126652 A | * | 5/1993 | |
| JP | H05322681 | * | 12/1993 | |
| JP | 2007019239 | | 1/2007 | |
| JP | 2007019239 A | * | 1/2007 | ....... H01L 21/67132 |
| JP | 2008053486 A | * | 3/2008 | ....... H01L 21/67132 |
| JP | 2013004584 | | 1/2013 | |
| JP | 2013004584 A | * | 1/2013 | |
| JP | 2019075509 A | * | 5/2019 | |
| JP | 2019175927 | | 10/2019 | |
| JP | 2019175927 A | * | 10/2019 | |
| JP | 2020038872 | | 3/2020 | |
| WO | WO-2007007531 A1 | * | 1/2007 | ....... H01L 21/67132 |

OTHER PUBLICATIONS

Translation JPH05322681 (Year: 1992).*
Translation_JP2019075509 (Year: 2019).*
International Search Report, PCT/JP2021/041646, dated Jan. 11, 2022, 2 pages.
Office Action in counterpart Korean application No. 10-2023-7024553 dated Sep. 12, 2024; with English translation; 12 pages.
Final Office Action in counterpart Korean application No. 10-2023-7024553 dated Jan. 31, 2025; with English translation; 7 pages.

* cited by examiner

APPARATUS AND METHOD FOR DETECTING TENSION ABNORMALITY IN DICING TAPE

TECHNICAL FIELD

The present invention relates to an apparatus and a method for detecting a tension abnormality in a dicing tape.

BACKGROUND ART

In a semiconductor manufacturing field, there is a process for cutting a semiconductor substrate such as a silicon wafer (hereinafter referred to as a "workpiece") into chips. In the process, a dicing tape affixed to the workpiece restricts a position of each of the chips so that the cutting into the chips can be efficiently performed.

Patent Literature 1 discloses that an expand tape E is affixed to a wafer W adsorbed and fixed to a table 211 with a pressing force of a affixing roller. Reference signs are in Patent Literature 1.

CITATION LIST

Patent Literature

Patent Literature 1: Japanese Patent Laid-Open No. 2013-4584

SUMMARY OF INVENTION

Technical Problem

The current situation is that when a new dicing tape is used, a sample workpiece is affixed to the dicing tape and an operator visually confirms its affixed state to adjust a parameter including tension of the dicing tape. In a production process, the operator also periodically visually confirms that the parameter is appropriately held from the affixed state of the dicing tape to which the workpiece is affixed.

There has been a problem that when the tension of the dicing tape is thus visually confirmed by the operator, the tension of the dicing tape may be insufficient depending on a degree of proficiency of the operator, for example, and a proper spacing between chips cannot be ensured at the time of expanding if the tension of the dicing tape is not appropriate, thereby making it difficult to detect a position of each of the chips.

Therefore, there occurs a technical problem to be solved to quantitatively determine whether or not tension of a dicing tape is appropriate and accurately detect a tension abnormality in the dicing tape, and an object of the present invention is to solve this problem.

Solution to Problem

To attain the above-described object, a dicing tape tension abnormality detecting apparatus according to the present invention is an apparatus for detecting a tension abnormality in a dicing tape to which a workpiece is affixed, which includes a measurement unit that measures, on the basis of displacement of the dicing tape occurring when gas is blown to a measurement point to which the workpiece is not affixed in the dicing tape, tension of the dicing tape at the measurement point, and a determination unit that determines that the tension of the dicing tape is appropriate when the tension of the dicing tape belongs in a previously set proper range of the tension of the dicing tape and determines that the tension of the dicing tape is abnormal when the tension of the dicing tape does not belong in the proper range.

This configuration makes it possible to accurately detect the tension abnormality in the dicing tape because the measurement unit measures the tension of the dicing tape and the determination unit quantitatively determines whether or not the tension of the dicing tape is appropriate on the basis of the tension of the dicing tape.

To attain the above-described object, a dicing tape tension abnormality detecting method according to the present invention is a method for detecting a tension abnormality in a dicing tape to which a workpiece is affixed, which includes the steps of measuring, on the basis of displacement of the dicing tape occurring when gas is blown to a measurement point to which the workpiece is not affixed in the dicing tape, tension of the dicing tape at the measurement point, and determining that the tension of the dicing tape is appropriate when the tension of the dicing tape belongs in a previously set proper range of the tension of the dicing tape and determining that the tension of the dicing tape is abnormal when the tension of the dicing tape does not belong in the proper range.

This configuration makes it possible to accurately detect the tension abnormality in the dicing tape because the measurement unit measures the tension of the dicing tape and the determination unit quantitatively determines whether or not the tension of the dicing tape is appropriate on the basis of the tension of the dicing tape.

Advantageous Effect of Invention

The present invention makes it possible to quantitatively determine whether or not tension of a dicing tape is appropriate and accurately detect a tension abnormality in the dicing tape.

DESCRIPTION OF EMBODIMENT

Figure 1:
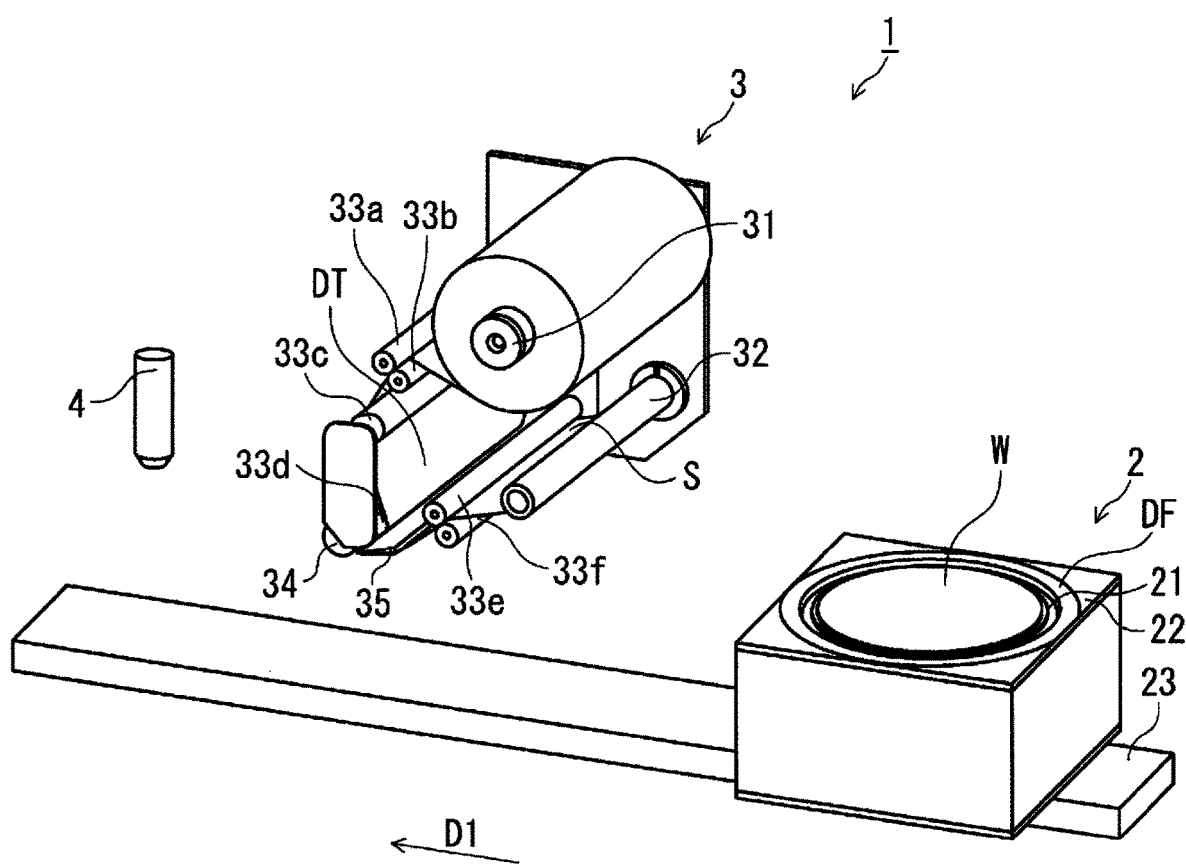
FIG. 1 is a perspective view illustrating a tape affixing system to which a tension abnormality detecting apparatus according to an embodiment of the present invention is applied.

An embodiment of the present invention will be described with reference to the drawings. Hereinafter, when reference is made to the number of components or a numerical value, amount, range, or the like of each of the components, the number or the like is not limited to a particular number but may be the particular number or more or the particular number or less unless otherwise stated or except when expressly limited to the particular number in principle.

When reference is made to a shape of each of components or a positional relationship among the components, one substantially approximate or similar to the shape or the like is included unless otherwise stated or except when considered to be expressly excluded in principle.

In the drawings, there is a case where some of components are omitted and characteristic portions are exaggerated by being enlarged, for example, in order to facilitate the understanding of features, and a dimension ratio or the like of each of the components is not necessarily the same as an actual one. In a cross-sectional view, hatching of some of the components may be omitted in order to facilitate the understanding of a cross-sectional structure of the components. In the present embodiment, terms representing directions such as up-down and left-right directions are not absolute, but are appropriate if each of the components is in an orientation depicted in the drawings. However, if the orientation has changed, the terms should be construed by being changed depending on the change in the orientation.

FIG. 1 is a perspective view illustrating a tape affixing system 1. The tape affixing system 1 integrally affixes a dicing tape DT to a workpiece W and a dicing frame DF. The workpiece W is a semiconductor substrate such as a silicon wafer, for example, but is not limited to this. The dicing tape DT is a ultraviolet curable tape, for example.

The tape affixing system 1 includes a conveyance apparatus 2, an affixing apparatus 3, and an apparatus for detecting a tension abnormality in the dicing tape DT (hereinafter merely referred to as a tension abnormality detecting apparatus) 4.

The conveyance apparatus 2 includes an inner periphery-side table 21 having the workpiece W held on its upper surface at the center, an outer periphery-side table 22 on which the dicing frame DF is placed, and a slider 23 that slides the inner periphery-side table 21 and the outer periphery table 22 in a conveyance direction D1.

An adsorbent composed of a porous material having an infinite number of pores is embedded in a surface of the inner periphery-side table 21. The roughness of the pores in the adsorbent is #400 or #800, for example.

The inner periphery-side table 21 is switchably connected to a vacuum source and a compressed air source not illustrated. When the vacuum source is started, a negative pressure is supplied between the workpiece W placed on the inner periphery-side table 21 and an upper surface (adsorption surface) of the adsorbent so that the workpiece W is adsorbed and held on the adsorption surface. When the compressed air source is started, compressed air (release air) is supplied between the workpiece W and the adsorption surface so that the adsorption between the workpiece W and the adsorption surface is released.

The affixing apparatus 3 is a tape affixing apparatus having a known configuration for affixing the dicing tape DT. The affixing apparatus 3 includes a feed roller 31 that feedably supports the dicing tape DT, a winding roller 32 that winds the dicing tape DT upon application of a feeding force thereto, first to sixth guide rollers 33a to 33f that exert tension on the dicing tape DT and regulate a track of the dicing tape DT, a pressing roller 34 that affixes the dicing tape DT to the workpiece W, and a knife plate 35 that regulates a track of a separator S peeled from the dicing tape DT.

The tension abnormality detecting apparatus 4 includes an air micrometer 41 as a measurement unit that measures the tension of the dicing tape DT.

The air micrometer 41 is arranged above a passage region of the slider 23. The air micrometer 41 is connected to a slide mechanism not illustrated that can slide the air micrometer 41 in a width direction D2 perpendicular to the conveyance direction D1. Examples of the air micrometer 41 include an air micrometer (DELTAIR 22H) manufactured by TOKYO SEIMITSU CO., LTD.

Figure 2A:
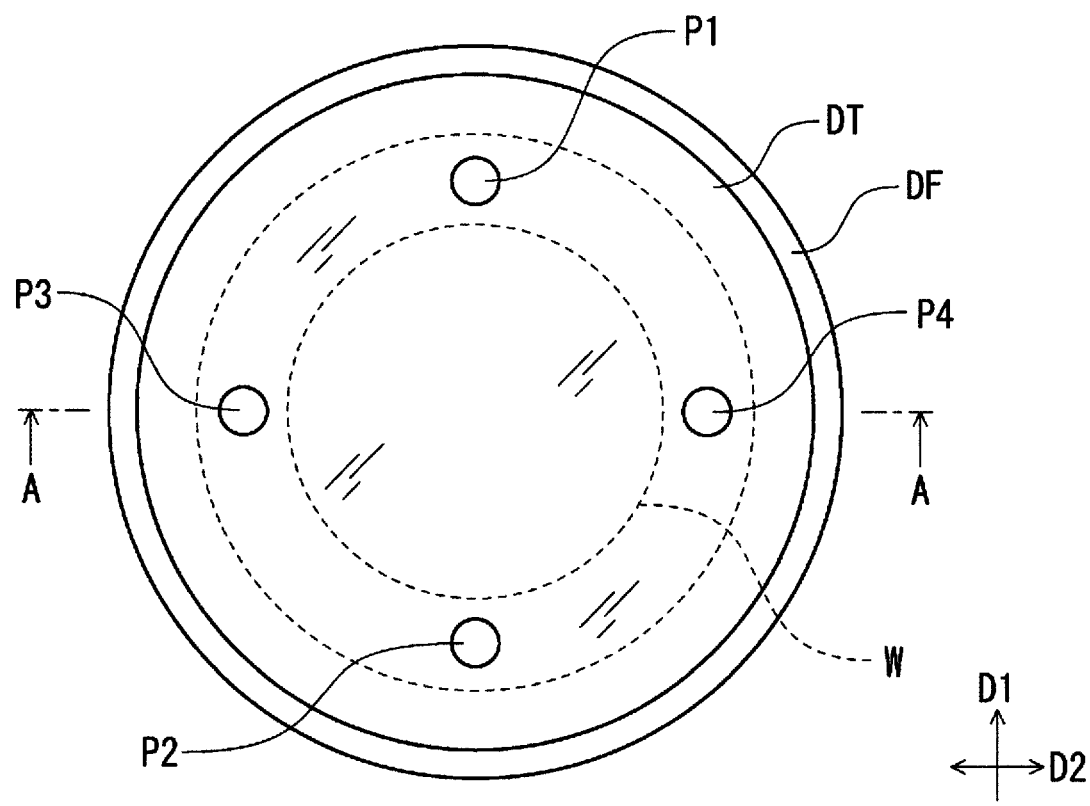
FIG. 2A is a plan view illustrating a positional relationship among four measurement points set in a dicing tape.
Figure 2B:
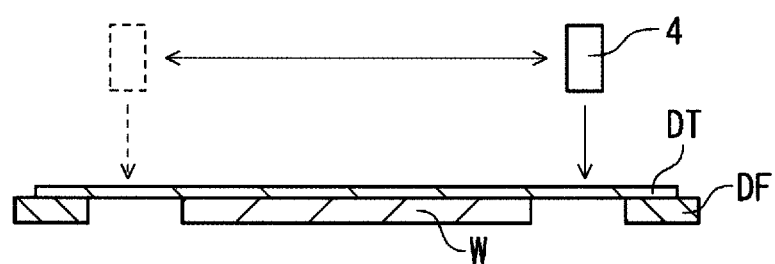
FIG. 2B is a side view cross section taken along line A-A in FIG. 2A.

As illustrated in FIGS. 2A-B, four measurement points P at which the air micrometer 41 makes tension measurement are respectively set in portions, to which the workpiece W is not affixed, in the dicing tape DT. The measurement points P are respectively assigned reference signs P1, P2, P3, and P4 when distinguished. The measurement point P1 is set in front of the workpiece W in the conveyance direction D1, and the measurement point P2 is set behind the workpiece w in the conveyance direction D1. The measurement points P3 and P4 are respectively set beside the workpiece W in the width direction D2.

Figure 3:
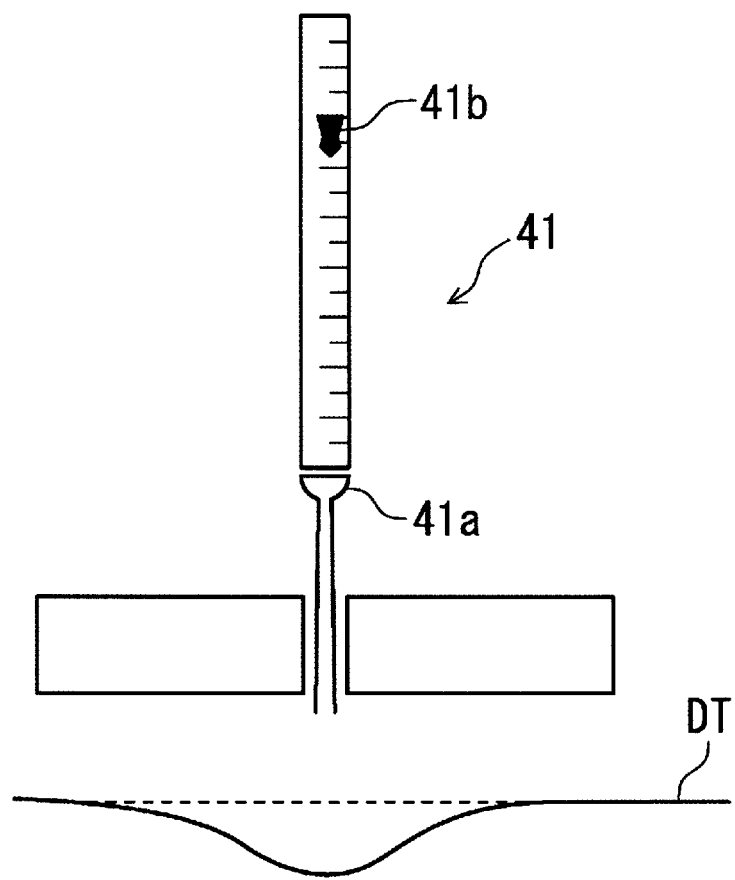
FIG. 3 is a schematic view illustrating a configuration of an air micrometer.

As illustrated in FIG. 3, the air micrometer 41 ejects air with a predetermined pressure toward the measurement points P from an air nozzle 41a to deflect the dicing tape DT, and the flow rate of the air changes depending on a change in gap dimension between the air nozzle 41a and the dicing tape DT so that a position of a float 41b changes. Tension of the dicing tape DT is measured, on the basis of a relationship between tension of the dicing tape DT previously obtained by an experiment or the like and a position of the float 41b that rises and falls depending on the tension of the dicing tape DT, from the position of the float 41b.

Figure 4:
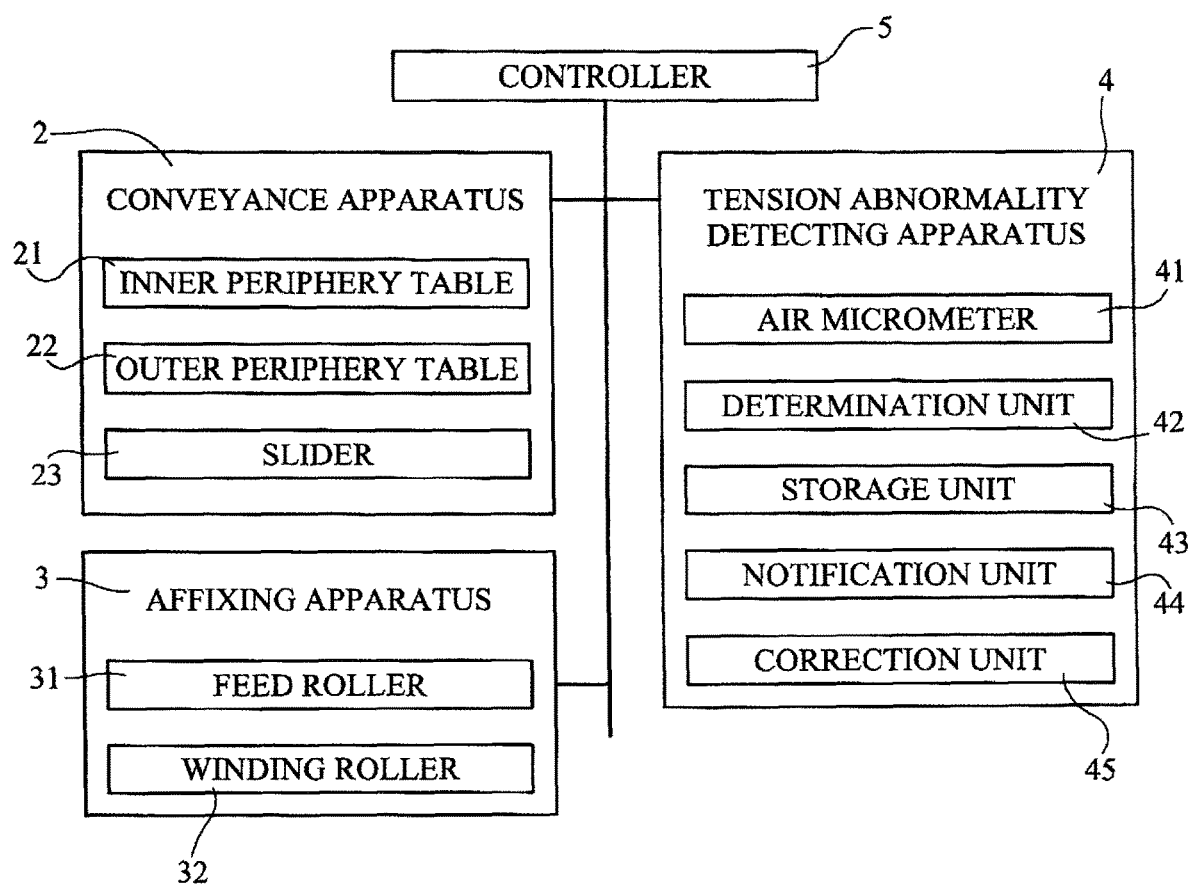
FIG. 4 is a block diagram illustrating a main configuration of a tape affixing system.

An operation of the tape affixing system 1 is controlled via a controller 5 illustrated in FIG. 4. The controller 5 controls each of components constituting the tape affixing system 1. The controller 5 is a computer, for example, and includes a CPU, a memory, and the like. A function of the controller 5 may be implemented by control using software, or may be implemented by one that operates using hardware.

Then, the operation of the tape affixing system 1 will be described with reference to the drawings.

<Workpiece Conveyance>

First, the dicing frame DF is transferred onto the outer periphery-side table 22 by a conveyance hand not illustrated, for example.

Then, the workpiece W is transferred onto the inner periphery-side table 21 by a conveyance hand not illustrated, for example. Then, when a negative pressure is supplied between the workpiece W and the adsorption surface from the compressed air source, the workpiece W is adsorbed on the inner periphery-side table 21. An upper surface of the workpiece W and an upper surface of the dicing frame DF are set to be substantially flush with each other.

<Tape Affixing>

Figure 5:
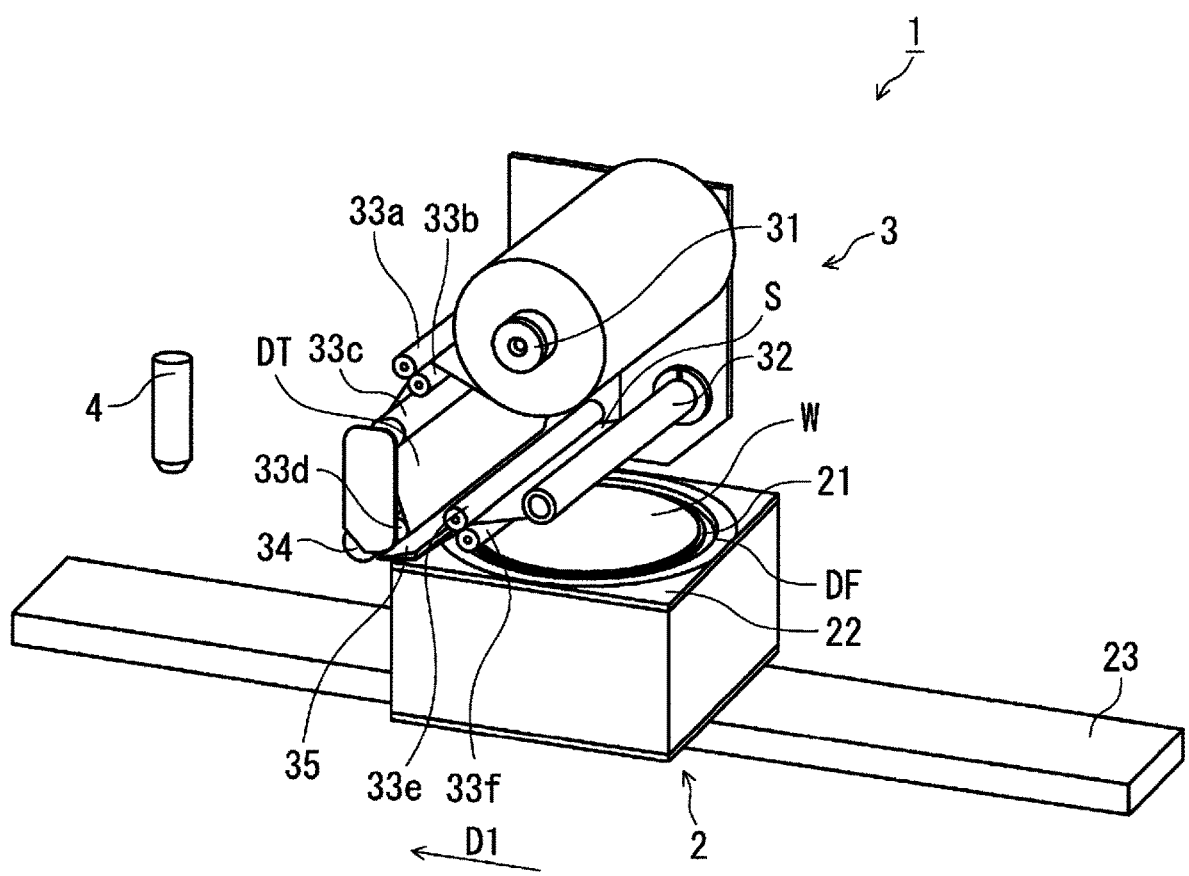
FIG. 5 is a perspective view illustrating how a dicing tape is affixed to a workpiece.

Then, as illustrated in FIG. 5, the slider 23 is driven, to move the inner periphery-side table 21 and the outer periphery-side table 22 such that one end (an affixing start position) of the dicing frame DF is arranged below the affixing apparatus 3. Respective movement speeds of the inner periphery-side table 21 and the outer periphery-side table 22 are set to 10 millimeters per second, for example.

Then, the winding roller 32 rotates to feed the dicing tape DT, and the pressing roller 34 presses the dicing tape DT against the one end of the dicing frame DF to affix the dicing tape DT with a predetermined pressing force. A rotational speed of the winding roller 32 is set to 10 millimeters per second, for example.

Then, the inner periphery-side table 21 and the outer periphery-side table 22 move in the conveyance direction D1, and the affixing of the dicing tape DT is gradually advanced. When the dicing tape DT reaches the other end (an affixing end position) of the dicing frame DF, the workpiece W and the dicing frame DF are integrally affixed to each other with the dicing tape DT interposed therebetween.

<Tension Determination>

Figure 6:
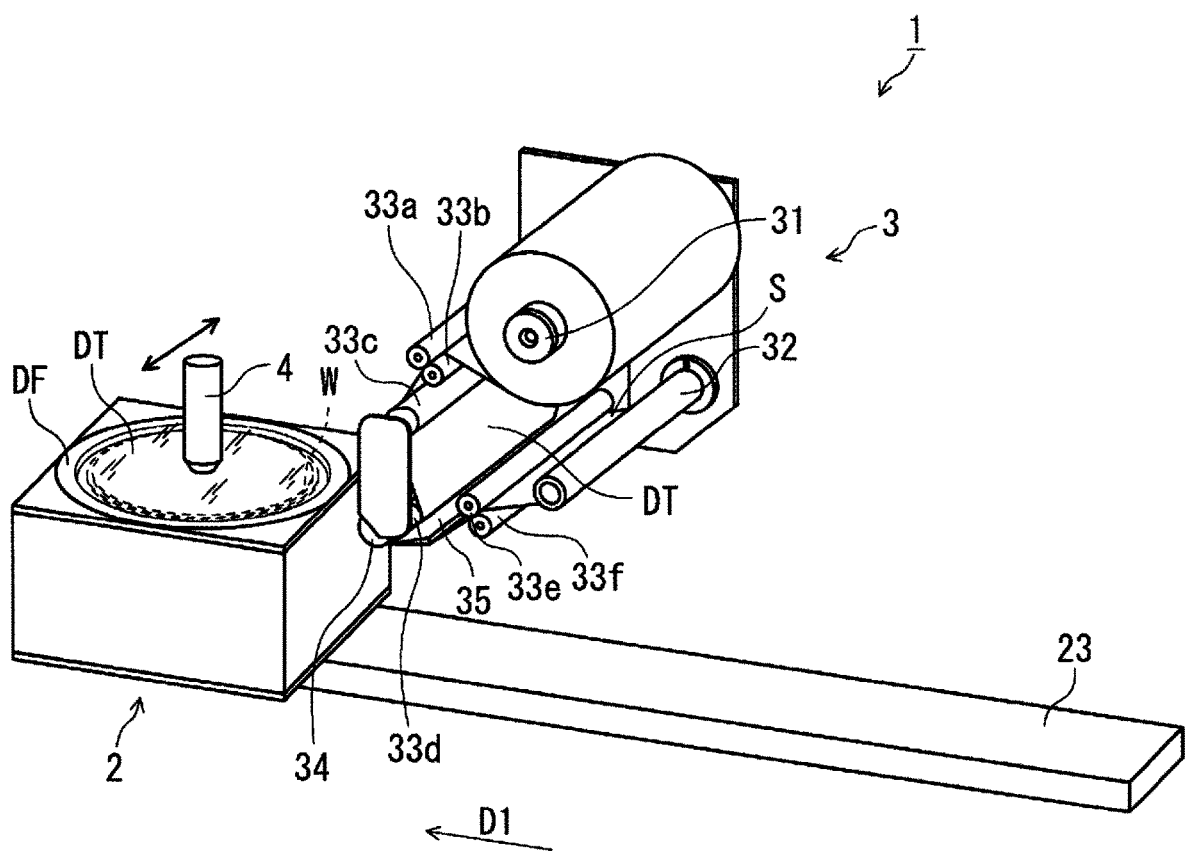
FIG. 6 is a perspective view illustrating how tension of a dicing tape is measured.

Then, as illustrated in FIG. 6, the slider 23 is driven, to move the inner periphery-side table 21 and the outer periphery-side table 22 such that the dicing tape DT is positioned below the air micrometer 41.

Further, when the air micrometer 41 is moved in the width direction D2 while the inner periphery-side table 21 and the outer periphery-side table 22 are moved in the conveyance direction D1, the air micrometer 41 measures the tension of the dicing tape DT at each of the measurement points P1, P2, P3, and P4. Measurement data of the air micrometer 41 is fed to a determination unit 42 illustrated in FIG. 4.

A tension distribution in the dicing tape DT is formed such that the tension is the highest at the center in the width direction D2 and gradually decreases toward the outer side in the width direction D2. That is, in the tension distribution in the dicing tape DT, the tension at the measurement points P1 and P2 is the highest, and the tension at the measurement points P3 and P4 is lower than that at the measurement points P1 and P2.

Then, the determination unit 42 determines whether or not a measurement value of the tension of the dicing tape DT at each of the measurement points P belongs in a proper range.

Specifically, when the tension of the dicing tape DT at the measurement point P is within the proper range, it is determined that the tension of the dicing tape DT is appropriate. If the tension of the dicing tape DT at the measurement point P does not belong in the proper range, it is determined that the tension of the dicing tape DT is abnormal. The proper range of the tension of the dicing tape DT is previously calculated by an experiment or the like, and is stored in a storage unit 43 illustrated in FIG. 4.

If it is determined that the tension of the dicing tape DT is abnormal, the tension abnormality detecting apparatus 4 may make notification of a tension abnormality via a notification unit 44 illustrated in FIG. 4. The notification by the notification unit 44 may be any of light, a voice, and a text message.

If it is determined that the tension of the dicing tape DT is abnormal, the tension abnormality detecting apparatus 4 may control a movement speed of the slider 23 and a winding speed of the winding roller 32 such that tension of a dicing tape DT to be affixed to a workpiece W subsequent to the workpiece W the tension of which has been measured falls within the proper range by a correction unit 45 illustrated in FIG. 4.

Generally, the tension of the dicing tape DT is set depending on a relative speed between the slider 23 and the winding roller 32. That is, if the movement speed of the slider 23 is relatively higher than the winding speed of the winding roller 32, tension to be exerted on the dicing tape DT is high. On the other hand, if the movement speed of the slider 23 is relatively lower than the winding speed of the winding roller 32, tension to be exerted on the dicing tape DT is low.

If the determination unit 42 determines that the tension of the dicing tape DT is below the proper range, the correction unit 45 increases the movement speed of the slider 23 or decreases the winding speed of the winding roller 32 such that the tension of the dicing tape DT increases.

On the other hand, if the determination unit 42 determines that the tension of the dicing tape DT is above the proper range, the correction unit 45 decreases the movement speed of the slider 23 or increases the winding speed of the winding roller 32 such that the tension of the dicing tale DT decreases.

Although a configuration using the air micrometer 41 as a measurement unit has been described as an example in the tension abnormality detecting apparatus 4 according to the above-described embodiment, any measurement unit may be used if it measures the tension of the dicing tape DT in a non-contact manner on the basis of an amount of displacement of the dicing tape DT occurring when gas is blown to the dicing tape DT. For example, the measurement unit may be a measurement instrument 46 including an air nozzle 46a and a laser displacement meter 46b, as illustrated in FIG. 7.

Figure 7:
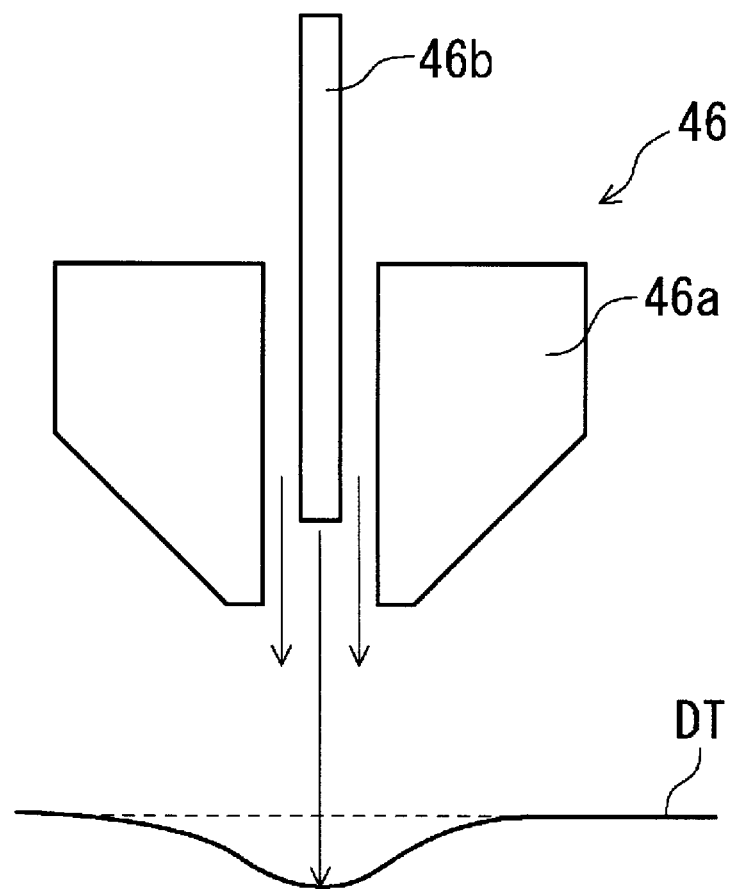
FIG. 7 is a schematic view illustrating a configuration of a measurement unit in a tension abnormality detecting apparatus according to a modification.

In the measurement instrument 46 as a measurement unit illustrated in FIG. 7, air with a predetermined pressure is ejected toward the measurement points P from the air nozzle 41a to deflect the dicing tape DT, and the laser displacement meter 46b measures the tension of the dicing tape DT from the amount of displacement of the dicing tape DT on the basis of a relationship between the tension of the dicing tape DT previously obtained by the experiment or the like and the amount of displacement of the dicing tape DT.

Although a case where the determination unit 42 determines whether or not each of the respective measurement values of the tension of the dicing tape DT at the measurement points P1, P2, P3, and P4 belongs in the proper range has been described as an example, the tension abnormality detecting apparatus 4 according to the above-described embodiment may be configured such that the determination unit 42 determines whether or not a maximum value of the tension of the dicing tape DT at the measurement points P1 and P2 belongs in the proper range so that too high tension is not exerted on the dicing tape DT or determines whether or not a minimum value of the tension of the dicing tape DT at the measurement points P3 and P4 belongs in the proper range so that too low tension is not exerted on the dicing tape DT.

Figure 8:
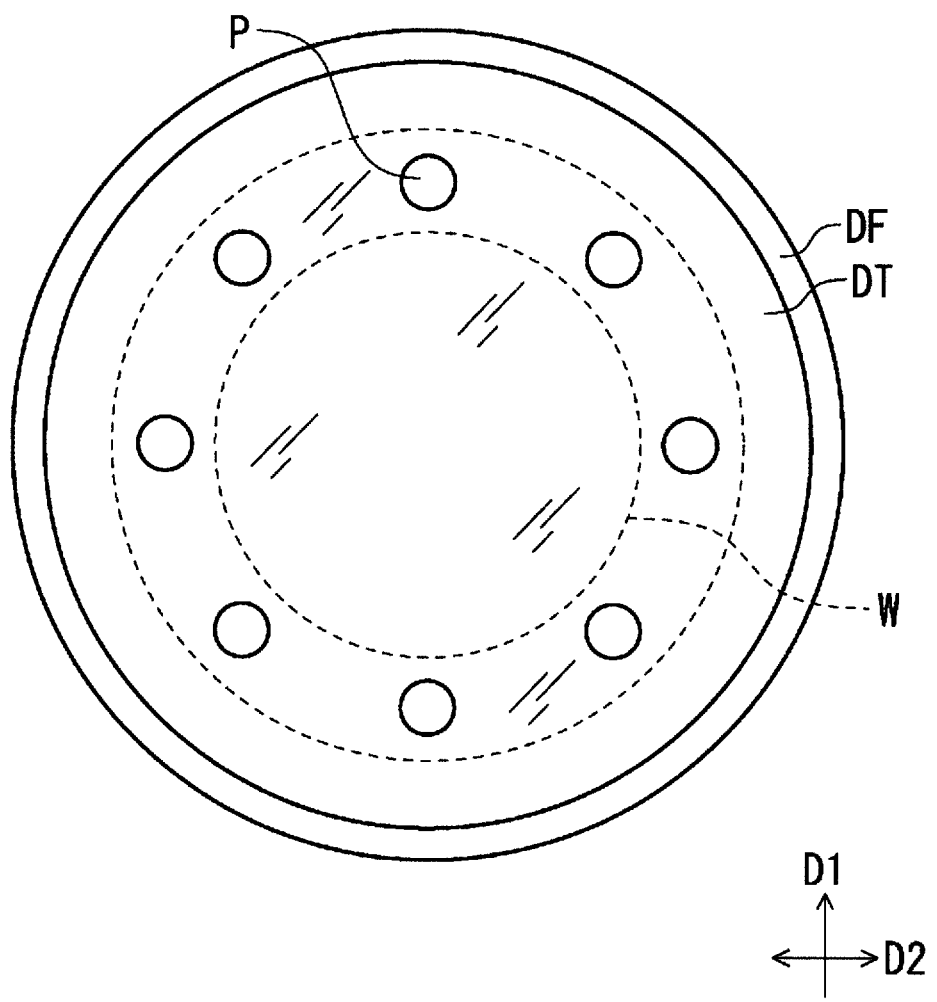
FIG. 8 is a plan view illustrating a positional relationship among eight measurement points set in a dicing tape.

Although the four measurement points P at which the air micrometer 41 makes measurement are set in the tension abnormality detecting apparatus 4 according to the above-described embodiment, the number and respective positions of measurement points P are arbitrarily changeable if the tension of the dicing tape DT can be reasonably grasped. For example, eight measurement points P, which are arranged to be equally spaced apart from one another on a concentric circle, may be set, as illustrated in FIG. 8. In this case, a finer tension distribution in the dicing tape DT can be obtained as illustrated in FIG. 8, as compared with that when the four measurement points P are set.

Thus, the tension abnormality detecting apparatus 4 according to the present embodiment is configured to include the air micrometer 41 that measures the tension of the dicing tape DT and the determination unit 42 that determines that the tension of the dicing tape DT is appropriate when the tension of the dicing tape DT belongs in the previously set proper range of the tension of the dicing tape DT and determines that the tension of the dicing tape DT is abnormal when the tension of the dicing tape DT does not belong in the proper range.

This configuration makes it possible to accurately detect the tension abnormality in the dicing tape DT because the air micrometer 41 can measure the tension of the dicing tape DT in a non-contact manner and the determination unit 42 can quantitatively determine whether or not the tension of the dicing tape DT is appropriate on the basis of the tension of the dicing tape DT.

Further, the air micrometer 41 can measure the tension of the dicing tape DT in a non-contact manner, thereby making it possible to detect the tension abnormality in the dicing tape DT without damaging the dicing tape DT and the workpiece W.

The tension abnormality detecting apparatus 4 is configured such that the air micrometer 41 measures the tension of the dicing tape DT at each of the measurement points P, to which the workpiece W is not affixed, in the dicing tape DT on the basis of displacement of the dicing tape DT occurring when air is blown to the measurement point P.

This configuration makes it possible to accurately detect the tension abnormality in the dicing tape DT because the air micrometer 41 directly measures the tension of the dicing tape DT at the measurement point P in a non-contact manner.

The tension abnormality detecting apparatus 4 is configured to further include the correction unit 45 that corrects, when the tension of the dicing tape DT at each of the measurement points P deviates from the proper range, tension of a dicing tape DT to which a workpiece W subsequent to the workpiece W is to be affixed.

This configuration makes it possible to prevent, when the tension abnormality in the dicing tape DT is detected, the dicing tape DT the tension of which is abnormal from flowing out because the correction unit 45 corrects the tension of the dicing tape DT to which the subsequent workpiece W is to be affixed.

The tension abnormality detecting apparatus 4 is configured such that the measurement points P1 and P2 are set in front of or behind the workpiece W in the conveyance direction D1 in which the dicing tape DT moves relative to the workpiece W in a planar view.

This configuration makes it possible to prevent tension to be exerted on the dicing tape DT from being too high by determining whether or not a maximum value of the tension to be exerted on the dicing tape DT belongs in the proper range because the measurement points P1 and P2 are set in a place where the tension to be exerted on the dicing tape DT is the highest.

The tension abnormality detecting apparatus 4 is configured such that the measurement points P3 and P4 are set beside the workpiece W in the width direction D2 of the dicing tape DT in a planar view.

This configuration makes it possible to prevent tension to be exerted on the dicing tape DT from being too low by determining whether or not a minimum value of the tension to be exerted on the dicing tape DT belongs in the proper range because the measurement points P3 and P4 are set in a place where the tension to be exerted on the dicing tape DT is liable to be low.

The tension abnormality detecting apparatus 4 is configured to further include the notification unit 44 that makes notification of the tension abnormality when the determination unit 42 determines that the tension of the dicing tape DT is abnormal.

This configuration makes it possible to prevent, when the tension abnormality in the dicing tape DT is detected, the dicing tape DT the tension of which is abnormal from flowing out because the notification unit 44 makes notification of the tension abnormality in the dicing tape DT.

The method for detecting the tension abnormality in the dicing tape DT to which the workpiece W is affixed according to the present embodiment includes the step of the air micrometer 41 measuring the tension of the dicing tape DT and the step of the determination unit 42 determining that the tension of the dicing tape DT is appropriate when the tension of the dicing tape DT belongs in the previously set proper range of the tension of the dicing tape DT and determining that the tension of the dicing tape DT is abnormal when the tension of the dicing tape DT does not belong in the proper range.

This configuration makes it possible to accurately detect the tension abnormality in the dicing tape DT because the air micrometer 41 measures the tension of the dicing tape DT in a non-contact manner and the determination unit 42 can quantitatively determine whether or not the tension of the dicing tape DT is appropriate on the basis of the tension of the dicing tape DT.

Further, the air micrometer 41 can measure the tension of the dicing tape DT in a non-contact manner, thereby making it possible to detect the tension abnormality in the dicing tape DT without damaging the dicing tape DT and the workpiece W.

It should be understood that various modifications can be made in addition to the foregoing without departing from the spirit of the present invention and the present invention covers the modifications.

The measurement unit is not limited to that which directly measures the tension of the dicing tape on the basis of displacement of the dicing tape, as described above, but may be that which indirectly measures the tension of the dicing tape.

REFERENCE SIGNS LIST

1: tape affixing system
2: conveyance apparatus
21: inner periphery-side table
22: outer periphery-side table
23: slider
3: affixing apparatus
31: feed roller
32: winding roller
33a~33f: guide roller
34: pressing roller
35: knife plate
4: tension abnormality detecting apparatus
41: air micrometer (measurement unit)
41a: air nozzle
41b: float
42: determination unit
43: storage unit
44: notification unit
45: correction unit
46: measurement instrument (measurement unit)
46a: air nozzle
46b: laser displacement meter
D1: conveyance direction
D2: width direction
DF: dicing frame
DT: dicing tape
W: workpiece

FIG. 4

| | |
|---|---|
| 2 | CONVEYANCE APPARATUS |
| 3 | AFFIXING APPARATUS |
| 4 | TENSION ABNORMALITY DETECTING APPARATUS |
| 5 | CONTROLLER |
| 21 | INNER PERIPHERY TABLE |

-continued

FIG. 4

| | |
|---|---|
| 22 | OUTER PERIPHERY TABLE |
| 23 | SLIDER |
| 31 | FEED ROLLER |
| 32 | WINDING ROLLER |
| 41 | AIR MICROMETER |
| 42 | DETERMINATION UNIT |
| 43 | STORAGE UNIT |
| 44 | NOTIFICATION UNIT |
| 45 | CORRECTION UNIT |

The invention claimed is:

1. An apparatus for detecting a tension abnormality in a dicing tape to which a workpiece is affixed, the dicing tape tension abnormality detecting apparatus comprising:
 a non-contact measurement unit that measures, on the basis of displacement of the dicing tape occurring when gas is blown to a measurement point at a location to which the workpiece is not affixed in to the dicing tape and between where the workpiece is affixed to the dicing tape and the dicing tape is affixed to a dicing frame, tension of the dicing tape at the measurement point; and
 a determination unit configured to determine the tension of the dicing tape is appropriate when the tension of the dicing tape belongs in a previously set proper range of the tension of the dicing tape and that the tension of the dicing tape is abnormal when the tension of the dicing tape does not belong in the proper range.

2. The dicing tape tension abnormality detecting apparatus according to claim 1, further comprising a correction unit that corrects, when the tension of the dicing tape at the measurement point deviates from the proper range, tension of a dicing tape to which a workpiece subsequent to the workpiece is to be affixed.

3. The dicing tape tension abnormality detecting apparatus according to claim 1, wherein the measurement point is set in front of or behind the workpiece in a conveyance direction in which the workpiece moves relative to the measurement unit in a planar view.

4. The dicing tape tension abnormality detecting apparatus according to claim 1, wherein the measurement point is set beside the workpiece in a width direction perpendicular to the conveyance direction in which the workpiece moves relative to the measurement unit in a planar view.

5. The dicing tape tension abnormality detecting apparatus according to claim 1, further comprising a notification unit that makes notification of a tension abnormality when the determination unit determines that tension of the dicing tape is abnormal.

6. An apparatus for detecting a tension abnormality in a dicing tape according to claim 1 wherein:
 said non-contact measurement unit comprises an air micrometer.

7. An apparatus for detecting a tension abnormality in a dicing tape according to claim 1 wherein:
 said non-contact measurement unit comprises a nozzle and a laser displacement meter.

8. A method for detecting a tension abnormality in a dicing tape to which a workpiece is affixed, the dicing tape tension abnormality detecting method comprising the steps of:
 measuring, on the basis of displacement of the dicing tape occurring when gas is blown to a measurement point to which the workpiece is not affixed in to the dicing tape, tension of the dicing tape at the measurement point; and
 determining that the tension of the dicing tape is appropriate when the tension of the dicing tape belongs in a previously set proper range of the tension of the dicing tape and determining that the tension of the dicing tape is abnormal when the tension of the dicing tape does not belong in the proper range.

* * * * *